United States Patent
Ko et al.

(10) Patent No.: US 9,006,788 B2
(45) Date of Patent: Apr. 14, 2015

(54) SOURCE/DRAIN RE-GROWTH FOR MANUFACTURING III-V BASED TRANSISTORS

(71) Applicant: Taiwan Semiconductor Manufacturing Company, Ltd., Hsin-Chu (TW)

(72) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/080,064

(22) Filed: Nov. 14, 2013

(65) Prior Publication Data
US 2014/0070276 A1    Mar. 13, 2014

Related U.S. Application Data

(62) Division of application No. 12/616,002, filed on Nov. 10, 2009, now Pat. No. 8,617,976.

(60) Provisional application No. 61/182,961, filed on Jun. 1, 2009.

(51) Int. Cl.
| | |
|---|---|
| *H01L 29/78* | (2006.01) |
| *H01L 21/28* | (2006.01) |
| *H01L 29/66* | (2006.01) |

(Continued)

(52) U.S. Cl.
CPC .......... *H01L 29/78* (2013.01); *H01L 21/28264* (2013.01); *H01L 29/4236* (2013.01); *H01L 29/66462* (2013.01); *H01L 29/66628* (2013.01);

(Continued)

(58) Field of Classification Search
CPC .......................... H01L 29/78; H01L 29/66462
USPC ...................... 257/192, 24, 59; 438/270, 283
See application file for complete search history.

(56) References Cited

U.S. PATENT DOCUMENTS

| | | |
|---|---|---|
| 5,621,227 A | 4/1997 | Joshi |
| 6,121,153 A | 9/2000 | Kikkawa |

(Continued)

FOREIGN PATENT DOCUMENTS

| | | |
|---|---|---|
| AU | 2003223306 A1 | 10/2003 |
| CN | 1289149 | 3/2001 |

(Continued)

OTHER PUBLICATIONS

Merriam-Webster OnLine definition of portion, 3 pages.

(Continued)

*Primary Examiner* — Nathan Ha
(74) *Attorney, Agent, or Firm* — Slater & Matsil, L.L.P.

(57) ABSTRACT

A method of forming an integrated circuit structure includes providing a substrate, and epitaxially growing a first semiconductor layer over the substrate. The first semiconductor layer includes a first III-V compound semiconductor material formed of group III and group V elements. The method further includes forming a gate structure on the first semiconductor layer, and forming a gate spacer on at least one sidewall of the gate structure. After the step of forming the gate structure, a second semiconductor layer including a second III-V compound semiconductor material is epitaxially grown on the first semiconductor layer.

20 Claims, 5 Drawing Sheets

(51) Int. Cl.
*H01L 29/778* (2006.01)
*H01L 29/812* (2006.01)
*H01L 29/423* (2006.01)

(52) U.S. Cl.
CPC ...... *H01L 29/66863* (2013.01); *H01L 29/7783* (2013.01); *H01L 29/8128* (2013.01)

(56) References Cited

U.S. PATENT DOCUMENTS

| | | | |
|---|---|---|---|
| 6,218,685 | B1 | 4/2001 | Nogome |
| 6,399,970 | B2 | 6/2002 | Kubo et al. |
| 6,475,869 | B1 | 11/2002 | Yu |
| 6,475,890 | B1 | 11/2002 | Yu |
| 6,512,252 | B1 | 1/2003 | Takagi et al. |
| 6,635,909 | B2 | 10/2003 | Clark et al. |
| 6,706,571 | B1 | 3/2004 | Yu et al. |
| 6,762,483 | B1 | 7/2004 | Krivokapic et al. |
| 6,858,478 | B2 | 2/2005 | Chau et al. |
| 6,867,433 | B2 | 3/2005 | Yeo et al. |
| 7,042,009 | B2 | 5/2006 | Shaheen et al. |
| 7,154,118 | B2 | 12/2006 | Lindert et al. |
| 7,190,050 | B2 | 3/2007 | King et al. |
| 7,247,887 | B2 | 7/2007 | King et al. |
| 7,265,008 | B2 | 9/2007 | King et al. |
| 7,382,021 | B2 | 6/2008 | Faulkner et al. |
| 7,508,031 | B2 | 3/2009 | Liu et al. |
| 7,528,465 | B2 | 5/2009 | King et al. |
| 7,560,784 | B2 | 7/2009 | Cheng et al. |
| 7,598,134 | B2 | 10/2009 | Mouli |
| 7,605,449 | B2 | 10/2009 | Liu et al. |
| 7,936,040 | B2 | 5/2011 | Wu |
| 7,956,383 | B2 | 6/2011 | Kuroda et al. |
| 8,058,692 | B2 | 11/2011 | Lai et al. |
| 8,174,073 | B2 | 5/2012 | Lee et al. |
| 8,237,153 | B2 | 8/2012 | Chui et al. |
| 8,314,652 | B2 | 11/2012 | Kuo et al. |
| 8,357,927 | B2 | 1/2013 | Jang |
| 8,440,542 | B2 | 5/2013 | Sekar et al. |
| 8,575,596 | B2 | 11/2013 | Pillarisetty et al. |
| 2003/0178677 | A1 | 9/2003 | Clark et al. |
| 2004/0104404 | A1* | 6/2004 | Bito ................ 257/192 |
| 2004/0173812 | A1 | 9/2004 | Currie et al. |
| 2004/0197975 | A1 | 10/2004 | Krivokapic et al. |
| 2004/0251479 | A1 | 12/2004 | Tsutsui et al. |
| 2004/0256647 | A1 | 12/2004 | Lee et al. |
| 2005/0029542 | A1* | 2/2005 | Mizutani ............ 257/192 |
| 2005/0093154 | A1 | 5/2005 | Kottantharayil et al. |
| 2005/0104137 | A1 | 5/2005 | Faulkner et al. |
| 2005/0153490 | A1 | 7/2005 | Yoon et al. |
| 2005/0186742 | A1 | 8/2005 | Oh et al. |
| 2005/0205934 | A1* | 9/2005 | Lochtefeld et al. ........ 257/347 |
| 2006/0057856 | A1 | 3/2006 | Senda et al. |
| 2006/0076625 | A1 | 4/2006 | Lee et al. |
| 2006/0148182 | A1 | 7/2006 | Datta et al. |
| 2006/0292719 | A1 | 12/2006 | Lochtefeld et al. |
| 2007/0102763 | A1 | 5/2007 | Yeo et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0238281 | A1 | 10/2007 | Hudait et al. |
| 2007/0243703 | A1 | 10/2007 | Pinnington et al. |
| 2007/0262353 | A1 | 11/2007 | Nishiyama et al. |
| 2008/0105899 | A1* | 5/2008 | Kim et al. ............. 257/192 |
| 2008/0135879 | A1* | 6/2008 | Shin et al. ............. 257/192 |
| 2008/0169485 | A1 | 7/2008 | Heyns et al. |
| 2008/0185691 | A1 | 8/2008 | Cheng et al. |
| 2008/0237577 | A1 | 10/2008 | Chui et al. |
| 2008/0237655 | A1 | 10/2008 | Nakabayashi et al. |
| 2008/0258176 | A1* | 10/2008 | Chou et al. ............ 257/192 |
| 2008/0258243 | A1 | 10/2008 | Kuroda et al. |
| 2008/0290470 | A1 | 11/2008 | King et al. |
| 2008/0296632 | A1 | 12/2008 | Moroz et al. |
| 2008/0315310 | A1 | 12/2008 | Rachmady et al. |
| 2009/0001415 | A1 | 1/2009 | Lindert et al. |
| 2009/0079014 | A1 | 3/2009 | Sandford et al. |
| 2009/0095984 | A1 | 4/2009 | Brask et al. |
| 2009/0181477 | A1 | 7/2009 | King et al. |
| 2009/0194790 | A1 | 8/2009 | Sato et al. |
| 2009/0242990 | A1 | 10/2009 | Saitoh et al. |
| 2009/0267113 | A1* | 10/2009 | Shimoida et al. ........ 257/192 |
| 2009/0272965 | A1 | 11/2009 | Rachmady et al. |
| 2010/0252816 | A1 | 10/2010 | Ko et al. |
| 2010/0252862 | A1 | 10/2010 | Ko et al. |
| 2010/0276668 | A1 | 11/2010 | Ko et al. |
| 2010/0301390 | A1 | 12/2010 | Ko et al. |
| 2012/0001239 | A1 | 1/2012 | Ko et al. |
| 2012/0037994 | A1 | 2/2012 | Saitoh et al. |
| 2013/0248929 | A1 | 9/2013 | Ko et al. |
| 2014/0134815 | A1 | 5/2014 | Ko et al. |

FOREIGN PATENT DOCUMENTS

| | | |
|---|---|---|
| CN | 1574399 A | 2/2005 |
| CN | 102244503 A1 | 11/2011 |
| EP | 0921575 A2 | 6/1999 |
| EP | 1488462 A2 | 12/2004 |
| JP | 2005005633 A | 1/2005 |
| JP | 2005005646 A | 1/2005 |
| JP | 2005019970 A | 1/2005 |
| JP | 2005051241 A | 2/2005 |
| JP | 2005062219 A | 3/2005 |
| JP | 2005521258 A | 7/2005 |
| JP | 2006516820 A | 7/2006 |
| JP | 2006521026 A | 9/2006 |
| JP | 2008014104 A | 1/2008 |
| JP | 2008508725 A | 3/2008 |
| JP | 20080141040 | 6/2008 |
| JP | 2008160131 A | 7/2008 |
| JP | 2008270521 A | 11/2008 |
| JP | 2008546181 A | 12/2008 |
| JP | 2009105163 A | 5/2009 |
| KR | 1020047012876 | 11/2004 |
| KR | 20060148182 A | 8/2007 |
| TW | 580771 B | 3/2004 |
| TW | I269358 | 12/2006 |
| WO | 03081640 A2 | 10/2003 |
| WO | 2007046150 A1 | 4/2007 |

OTHER PUBLICATIONS

Merriam-Webster Online definition of region, 3 pages.

Chuang, R.W., et al., •Gallium nitride metal-semiconductor-metal photodetectors prepared on silicon substrates,• Journal of Applied Physics, vol. 102, 2007, pp. 073110-1 • 073110-4.

Chui, C.O., et al., •Germanium n-type shallow junction activation dependences,• Applied Physics Letters, 2005, pp. 091901-1 • 091909-3, vol. 87.

Datta, S., et al., •Ultrahigh-Speed 0.5 V Supply Voltage In0.7Ga0.3As Quantum-Well Transistors on Silicon Substrate,• IEEE Electron Device Letters, Aug. 2007, pp. 685-687, , vol. 28, No. 8.

Iwakami, S., et al., •AlGaN/GaN Heterostructure Field-Effect Transistors (HFETs) on Si Substrates for Large-Current Operation,• Japanese Journal of Applied Physics, 2004, pp. L831-L833, , vol. 43, No. 7A.

Jackson, S.L., et al., •Silicon Doping of InP, GaAs, In0.53Ga0.47As and In0.49Ga0.51P Grown by Gas Source and Metalorganic Molecular Beam Epitaxy Using a SiBr4 Vapor Source,• IEEE, Conference Proceedings, Sixth International Conference on Indium Phosphide and Related Materials, Mar. 27-31, 1994, pp. 57-60.

Krishnamohan, T., et al., •High-Mobility Low Band-To-Band-Tunneling Strained-Germanium Double-Gate Heterostructure FETs: Simulations,• IEEE Transactions on Electron Devices, May 2006, pp. 1000-1009, vol. 53, No. 5.

Posselt, M., et al., •P implantation into preamorphized germanium and subsequent annealing: Solid phase epitaxial regrowth, P diffusion, and activation,• Journal of Vacuum Science Technology, vol. 26, Jan./Feb. 2008, pp. 430-434.

(56) References Cited

OTHER PUBLICATIONS

Satta, A., "Diffusion, activation, and regrowth behavior of high dose P implants in Ge," Applied Physics Letters, 2006, pp. 162118-1 • 162118-3, vol. 88.

Shih, C.-F., et al., "Blue, Green, and White InGaN Light-Emitting Diodes Grown on Si," Japanese Journal of Applied Physics, 2005, pp. L140-L143, vol. 44, No. 4.

Vanamu, G., et al., "Growth of high-quality GaAs on Ge/Si1-xGex on nanostructured silicon substrates," Applied Physics Letters, pp. 251909-1 • 251909-3, vol. 88, 2006.

Vurgaftman, I., et al., "Band parameters for III-V compound semiconductors and their alloys," Journal of Applied Physics, Jun. 1, 2001, pp. 5815-5875, vol. 89, No. 11.

Yamane, Y., et al., "Selective Formation of Ohmic Contacts to n-GaAs," IEEE, Electronics Letters, Apr. 9, 1987, pp. 382-383, vol. 23, No. 8.

Satta, A., "P implantation doping of Ge: Diffusion, activation, and recrystallization," Journal of Vacuum Science Technology, vol. 24, Jan./Feb. 2006, pp. 494-498.

* cited by examiner

SOURCE/DRAIN RE-GROWTH FOR MANUFACTURING III-V BASED TRANSISTORS

This application is a divisional of U.S. patent application Ser. No. 12/616,002, entitled "Source/Drain Re-Growth for Manufacturing III-V Based Transistors," filed on Nov. 10, 2009, which application claims the benefit of U.S. Provisional Application No. 61/182,961 filed on Jun. 1, 2009, entitled "Source/Drain Re-Growth for Manufacturing III-V Based Transistors," which application is hereby incorporated herein by reference.

TECHNICAL FIELD

This invention relates generally to integrated circuit structures, and more particularly to transistors comprising III-V compound semiconductors and methods for forming the same.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Figure 1:
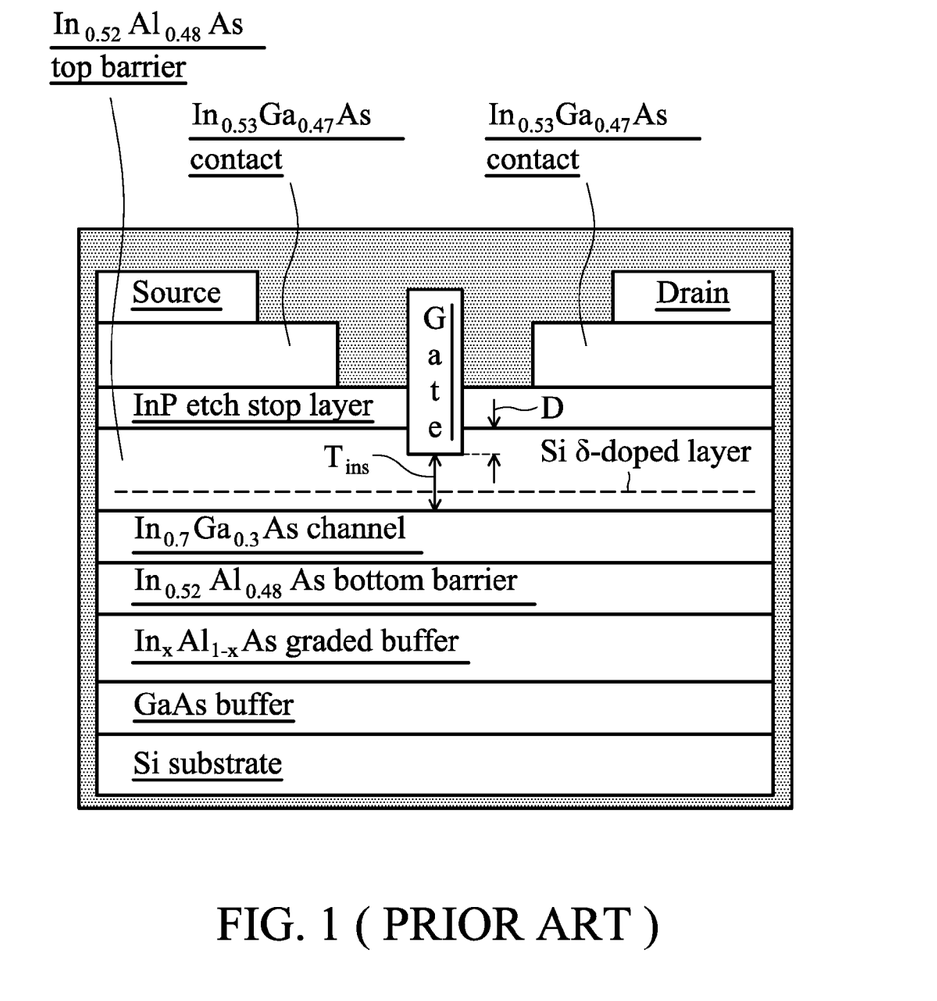
FIG. 1 illustrates a conventional transistor comprising III-V compound semiconductor materials of group III and group V elements.

Compound semiconductor materials of group III and group V elements (commonly known as III-V compound semiconductors) are good candidates for forming NMOS transistors for their high electron mobility. Therefore, III-V compound semiconductors have been used to form NMOS transistors. To reduce the manufacturing cost, methods for forming PMOS transistors using III-V compound semiconductors have also been explored. FIG. 1 illustrates a conventional transistor incorporating III-V compound semiconductors. In the formation process, a plurality of layers is blanket formed on a silicon substrate, wherein the plurality of layers includes a buffer layer formed of GaAs, a graded buffer formed of $In_xAl_{1-x}As$ (with x between, but not equal to, 0 and 1), a bottom barrier formed of $In_{0.52}Al_{0.48}As$, a channel formed of $In_{0.7}Ga_{0.3}As$, a top barrier formed of $In_{0.52}Al_{0.48}As$, an etch stop layer formed of InP, and a contact layer formed of $In_{0.53}Ga_{0.47}As$. A first etch is performed to etch through the contact layer stopping at the etch stop layer to form a first recess. A second etch is then performed to etch through the etch stop layer, and etch into a portion of the top barrier to form a second recess. A gate, which is formed of metal, is then formed in the second recess. The resulting transistor has the advantageous features resulting from the quantum well being formed of the bottom barrier, the channel, and the top barrier.

The above-described structure and process steps, however, suffer from process difficulties. To have good short-channel controllability, distance $T_{ins}$ between the gate and the channel needs to be carefully controlled, which requires that etching depth D be accurately controlled. However, accurately controlling etching depth D is difficult. Particularly, it is difficult to achieve uniform etching depth D throughout the respective chip. It is realized that at the time the second recess is formed, a plurality of recesses is formed simultaneously for forming other transistors. However, distance $T_{ins}$ of the plurality of recesses at different locations of a chip/wafer may be different, resulting in non-uniformity in the performance of the resulting transistors. A method and structure for overcoming the above-described shortcomings in the prior art are thus needed.

SUMMARY OF THE INVENTION

In accordance with one aspect of the present invention, a method of forming an integrated circuit structure includes providing a substrate; and epitaxially growing a first semiconductor layer over the substrate. The first semiconductor layer includes a first III-V compound semiconductor material formed of group III and group V elements. The method further includes forming a gate structure on the first semiconductor layer; and forming a gate spacer on a sidewall of the gate structure. After the step of forming the gate structure, a second semiconductor layer including a second III-V compound semiconductor material is epitaxially grown on the first semiconductor layer.

Other embodiments are also disclosed.

The advantageous features of the present invention include improved short channel control of III-V transistors and uniform threshold voltages for transistors throughout chips/wafers. Further, the external resistances of the transistors are reduced, and the drive currents of the transistors are increased.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 4B are cross-sectional views of intermediate stages in the manufacturing of a transistor in accordance with an embodiment.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel transistors comprising compound semiconductor materials of group III and group V elements (referred to as III-V compound semiconductors hereinafter) and the methods of forming the same are provided. The intermediate stages in the manufacturing of embodiments of the present invention are illustrated. The variations of the embodiments are discussed. Throughout the various views and illustrative embodiments of the present invention, like reference numbers are used to designate like elements.

Figure 2:
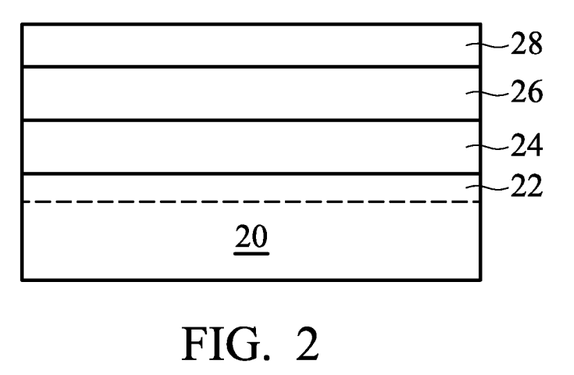

Referring to FIG. 2, substrate 20 is provided. Substrate 20 may be a semiconductor substrate formed of silicon, germanium, SiGe, InP, and/or other semiconductor materials. A plurality of layers, which may be formed of compound semiconductor materials, is epitaxially grown on substrate 20. In an embodiment, the plurality of layers includes bottom barrier 24, channel layer 26, and top barrier 28. In an embodiment, channel layer 26 has a first bandgap, while bottom barrier 24 and top barrier 28 have a second bandgap greater than the first bandgap. Accordingly, layers 24, 26, and 28 form a quantum well. In an exemplary embodiment, the second bandgap is greater than the first bandgap by about 0.1 eV, although higher or lower bandgap differences may also apply. The appropriate materials of channel layer 26, top barrier 28 and bottom barrier 24 may be selected by comparing the bandgaps of the available semiconductor materials with high carrier mobilities, which may include, but are not limited to, silicon, germanium, GaAs, InP, GaN, InGaAs, InAs, InSb, InAlAs, GaSb, AlSb, AlAs, AlP, GaP, and combinations thereof. In an exemplary embodiment, channel layer 26 comprises $In_{0.7}Ga_{0.3}As$, while bottom barrier 24 and top barrier 28 comprise $In_{0.52}Al_{0.48}As$. In other embodiments, channel layer 26 is formed of InGaAs, while bottom barrier 24 and top barrier 28 are formed of GaAs. In yet other embodiments, channel layer 26 is formed of InAs, while bottom barrier 24 and top barrier 28 comprise InAlAs. Bottom barrier 24 may have a thickness between about 5 nm and about 10 μm, channel layer 26 may have a thickness between about 2 nm and about 50 nm, and top barrier 28 may have a thickness between about 5 nm and about 500 nm. It is realized, however, that the dimensions recited throughout the description are merely examples, and may be changed if different formation technologies are used.

Optionally, additional buffer layer(s) such as buffer layer 22 may be formed on top of substrate 20. Buffer layer 22 may have a lattice constant between the lattice constant of substrate 20 and the lattice constant of the overlying layer such as bottom barrier 24, so that the transition of lattice constants from lower layers to upper layers is less abrupt.

Figure 3:
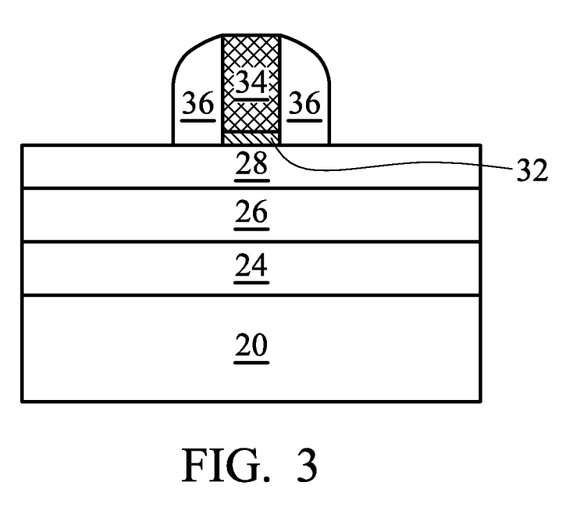

FIG. 3 illustrates the formation of a gate structure and gate spacers 36. The gate structure includes gate dielectric 32 and gate electrode 34. Gate dielectric 32 may be formed of commonly used dielectric materials such as silicon oxide, silicon nitride, oxynitrides, multi-layers thereof, and combinations thereof. Gate dielectric 32 may also be formed of high-k dielectric materials. The exemplary high-k materials may have k values greater than about 4.0, or even greater than about 7.0, and may include aluminum oxide, hafnium oxide, hafnium oxynitride, hafnium silicate, zirconium silicate, yttrium oxide, cerium oxide, titanium oxide, tantalum oxide, and combinations thereof. Gate electrode 34 may be formed of doped polysilicon, metals, metal nitrides, metal silicides, and the like. Gate spacer 36 may be formed silicon oxide, silicon nitride, composite layers thereof, and the like. The formation processes of gate dielectric 32, gate electrode 34, and gate spacers 36 are known in the art, and hence are not described in detail herein.

Figure 4A:
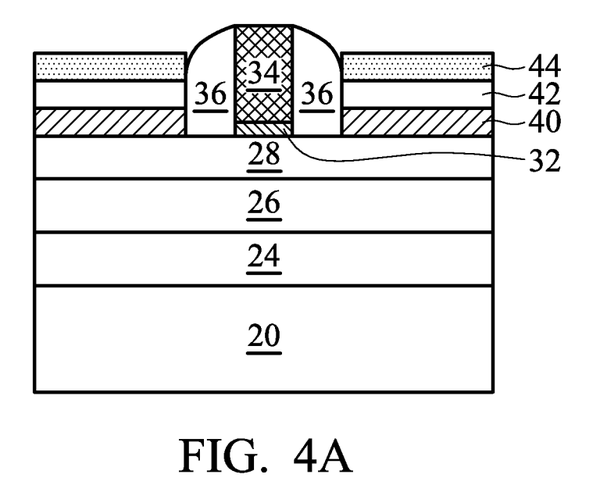

FIG. 4A illustrates the formation of epitaxial layer(s). In an embodiment, the epitaxial layer(s) include a high-bandgap compound semiconductor layer 40 whose bandgap may also be greater than the bandgap of channel layer 26. Layer 40 may also be formed of a same material (with a same composition and a same bandgap) as top barrier 28, which may be $In_{0.52}Al_{0.48}As$, for example. Alternatively, layer 40 may be formed of a material similar to, but slightly different from, that of top barrier 28, so that the bandgap of layer 40 is lower than that of top barrier 28. For example, layer 40 may have a composition between the composition of channel layer 26 (for example $In_{0.7}Al_{0.3}As$) and the composition of top barrier 28 (for example, $In_{0.52}Al_{0.48}As$), with an indium to aluminum ratio between 0.52/0.48 and 0.7/0.3. In an exemplary embodiment, layer 40 has a thickness greater than about 5 nm.

Contact layer 42 may be formed on layer 40. Throughout the description, layers 40 and 42 are also referred to as a first sub-layer and a second sub-layer, respectively, of the epitaxy layer(s) grown on top barrier 28. Contact layer 42 may have a smaller bandgap than that of layer 40. Further, during the epitaxial growth, contact layer 42 may be in-situ doped to a high impurity concentration, which may be greater than about $1 \times 10^{18}/cm^3$. If the resulting transistor is an NMOS transistor, the doped impurity may include silicon (Si). Conversely, if the resulting transistor is a PMOS transistor, the doped impurity may include zinc (Zn) and/or beryllium (Be). As a result of the small bandgap and high doping concentration, the resistivity of contact layer 42 is low. As a comparison, layer 40 may be undoped with Si, Zn, and Be. Layers 40 and 42 may be formed using selective epitaxy growth (SEG), which may be performed using metal organic chemical vapor deposition (MOCVD), although they may also be formed using non-selective deposition methods. However, additional masks may be needed.

In alternative embodiments, contact layer 42 is formed of group IV elements such as silicon, germanium, or silicon germanium. The group IV elements are the majority elements with, for example, over about 50 percent, or even over about 90 percent atomic percentage of contact layer 42. P-type impurities such as boron and/or indium may be doped into contact layer 42 if the resulting MOS device is intended to be a PMOS device. Alternatively, n-type impurities such as phosphorous and/or arsenic may be doped if the resulting MOS device is intended to be an nMOS device. The exemplary doping concentration of the p-type or n-type impurities may be between about $1 \times 10^{18}/cm^3$ and about $1 \times 10^{21}/cm^3$.

Next, metal layer 44 is formed on contact layer 42, wherein metal layer 44 may include nickel, aluminum, palladium, gold, and/or the like. Additional anneal processes may be performed so that metal layer 44 reacts with the underlying contact layer 42 to reduce the contact resistance. Throughout the description, metal layer 44 and the underlying contact layer 42 are referred to as source and drain regions due to their relatively low resistivities. A MOS device is thus formed.

It is realized that more layers may be formed over and/or under each of layers 40 and 42. The additional layers may generally be allocated with the trend that the upper layers have higher doping concentrations and/or lower bandgaps, while the lower layers have lower doping concentrations (if doped at all) and/or higher bandgaps.

Figure 4B:
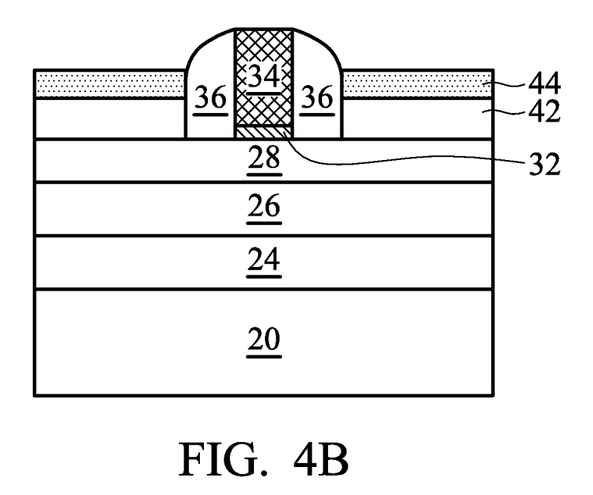

FIG. 4B illustrates an alternative embodiment, wherein contact layer 42, which has a bandgap lower than the bandgap of top barrier 28, directly contacts top barrier 28, while layer 40 having the relatively high bandgap is not formed. Contact layer 42 may be formed of the same materials as discussed in preceding paragraphs, and hence may be doped to a high doping concentration. Metal layer 44 may also be formed on contact layer 42.

Figure 5:
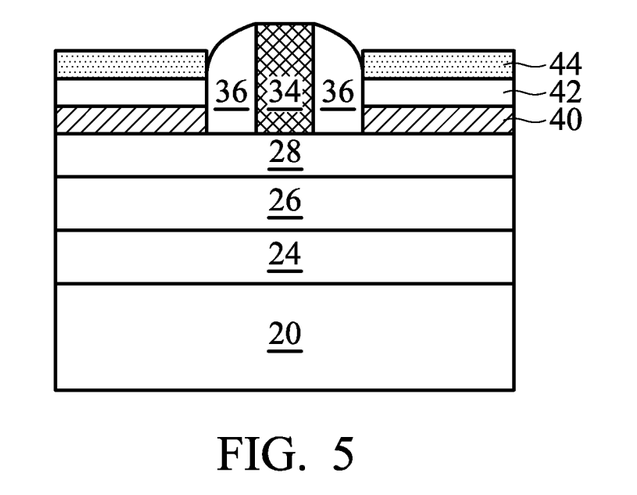
FIGS. 5 through 7 are cross-sectional views of transistors in accordance with alternative embodiments of the present invention.

FIG. 5 illustrates an alternative embodiment, which is similar to the embodiment shown in FIG. 4A, except no gate dielectric is formed. Gate electrode 34 directly contacts top barrier 28. In this case, the depletion region (not shown) resulting from the Schottky barrier between gate electrode 34 and top barrier 28 acts as the gate dielectric. Again, layer 40 as shown in FIG. 5 may be omitted, and contact layer 42 may be formed directly on top barrier 28.

Figure 6:
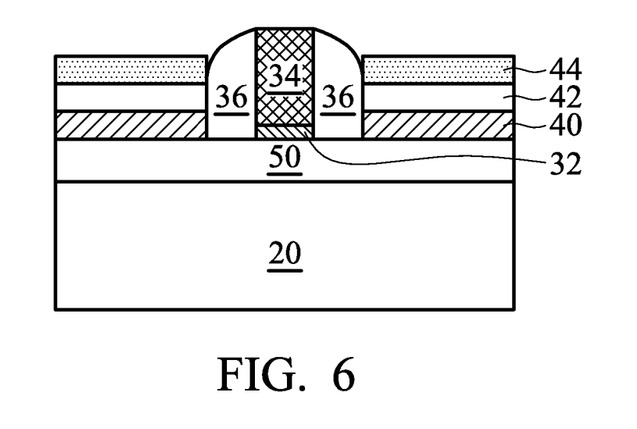
Figure 7:
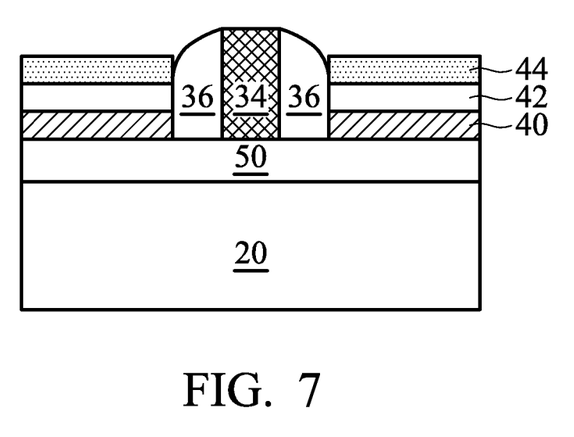

Referring to FIG. 6, the quantum well formed of bottom barrier 24, channel layer 26 and top barrier 28 (refer to FIG. 2) may be replaced by channel layer 50. Channel layer 50 may be formed of a III-V compound semiconductor such as GaAs, InP, GaN, InGaAs, InAs, InSb, InAlAs, GaSb, AlSb, AlAs, AlP, GaP, and combinations thereof. FIG. 7 illustrates a similar structure as shown in FIG. 6, wherein no gate dielectric is formed. Again, in both FIGS. 6 and 7, layer 40 may be omitted, thus contact layer 42 may be formed directly on channel layer 50, or spaced apart from channel layer 50 by layer 40.

The embodiments of the present invention have several advantageous features. By re-growing layers 40 and 42 (refer to FIGS. 4A through 7), the gate structure including gate electrode 34 and possibly gate dielectric 32 may be formed on, instead of extending into, top barrier layer 28. The distance between the gate structure and channel layer 26 may thus be controlled with the accuracy of a couple of monolayers so that the short-channel effect is accurately controlled. Particularly, without the need to etch into top barrier 28, the distances between the gate electrodes and channel layer 26 for all transistors throughout the respective chip/wafer are more uniform, resulting in uniform threshold voltages and short-control controllability throughout the chip/wafer. In addition, with the formation of contact layer 42, which has a low bandgap and a high doping concentration, the external resistance in the source and drain regions may be reduced, and hence the drive currents of the transistors may be improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a substrate;
   a first semiconductor layer over the substrate, wherein the first semiconductor layer comprises a first III-V compound semiconductor material formed of group III and group V elements;
   a gate structure on the first semiconductor layer;
   a gate spacer on at least one sidewall of the gate structure; and
   a second semiconductor layer comprising a second III-V compound semiconductor material over the first semiconductor layer; and
   a metal layer overlying and in contact with the second semiconductor layer, with a same continuous edge of the gate spacer contacting edges of both the second semiconductor layer and the metal layer, wherein the gate spacer spaces apart the second semiconductor layer and the metal layer from the gate structure.

2. The integrated circuit structure of claim 1, wherein the same continuous edge of the gate spacer is smooth.

3. The integrated circuit structure of claim 1, wherein an interface between the first semiconductor layer and the second semiconductor layer is level with an interface between the first semiconductor layer and the gate structure.

4. The integrated circuit structure of claim 1, wherein the second semiconductor layer is doped with an element selected from the group consisting essentially of Si, Zn, Be, and combinations thereof.

5. The integrated circuit structure of claim 1, wherein the second semiconductor layer further comprises:
   a first sub-layer comprising the second III-V compound semiconductor material and having a first bandgap; and
   a second sub-layer having a second bandgap smaller than the first bandgap, wherein the second sub-layer comprises a third III-V compound semiconductor material doped with an element selected from the group consisting essentially of Si, Zn, Be, and combinations thereof.

6. The integrated circuit structure of claim 1, wherein the gate structure comprises a gate dielectric and a gate electrode over the gate dielectric.

7. The integrated circuit structure of claim 1, wherein the gate structure comprises a gate electrode contacting the second semiconductor layer.

8. The integrated circuit structure of claim 1, wherein the second semiconductor layer further comprises:
   a first sub-layer comprising the second III-V compound semiconductor material and having a first bandgap; and
   a second sub-layer comprising a group IV semiconductor material as a majority element over the first sub-layer.

9. The integrated circuit structure of claim 1, wherein the first semiconductor layer and the second semiconductor layer have a same composition and a same bandgap.

10. An integrated circuit structure comprising:
    a semiconductor substrate;
    a first semiconductor layer over the semiconductor substrate, wherein the first semiconductor layer comprises a first III-V compound semiconductor material formed of group III and group V elements;
    a gate structure on the first semiconductor layer;
    a gate spacer on at least one sidewall of the gate structure; and
    a second semiconductor layer comprising a second III-V compound semiconductor material over the first semiconductor layer, wherein the first semiconductor layer and the second semiconductor layer have an interface level with a bottom surface of the gate structure and a bottom surface of the gate spacer.

11. The integrated circuit structure of claim 10, wherein the first semiconductor layer and the second semiconductor layer have different compositions.

12. The integrated circuit structure of claim 10, wherein the first semiconductor layer and the second semiconductor layer have a same composition and a same bandgap.

13. The integrated circuit structure of claim 10, wherein the first semiconductor layer further comprises:
    a bottom barrier;
    a channel layer over the bottom barrier; and
    a top barrier over the channel layer, wherein bandgaps of the bottom barrier and the top barrier are greater than a bandgap of the channel layer.

14. The integrated circuit structure of claim 13, wherein the second semiconductor layer further comprises:
    a first sub-layer formed of the second III-V compound semiconductor material, wherein the first sub-layer has a bandgap greater than a bandgap of the channel layer; and
    a second sub-layer formed of a third III-V compound semiconductor material, wherein the second sub-layer has a bandgap smaller than the bandgap of the first sub-layer.

15. The integrated circuit structure of claim 10 further comprising a metal layer over and contacting the second semiconductor layer.

16. The integrated circuit structure of claim 10 further comprising a third semiconductor layer comprising a group IV semiconductor material as a majority element over the second semiconductor layer.

17. An integrated circuit structure comprising:
   a substrate;
   a first semiconductor layer over the substrate, wherein the first semiconductor layer comprises a first III-V compound semiconductor material formed of group III and group V elements;
   a gate structure on the first semiconductor layer;
   a gate spacer on at least one sidewall of the gate structure; and
   a second semiconductor layer comprising a group IV semiconductor material as a majority element over the first semiconductor layer, wherein the gate spacer adjoins the second semiconductor layer and the gate structure, and wherein the gate spacer spaces apart the second semiconductor layer from the gate structure.

18. The integrated circuit structure of claim 17, wherein the first semiconductor layer further comprises:
   a bottom barrier;
   a channel layer over the bottom barrier; and
   a top barrier over the channel layer, wherein bandgaps of the bottom barrier and the top barrier are greater than a bandgap of the channel layer.

19. The integrated circuit structure of claim 17 further comprising a metal layer overlying and contacting the second semiconductor layer.

20. The integrated circuit structure of claim 17, wherein the first semiconductor layer and the second semiconductor layer have a same composition and a same bandgap.

* * * * *